United States Patent [19]
Watanabe

[11] Patent Number: 5,532,956
[45] Date of Patent: Jul. 2, 1996

[54] MEMORY CELL STRUCTURE FOR SEMICONDUCTOR DEVICE AND DYNAMIC SEMICONDUCTOR MEMORY DEVICE

[75] Inventor: Hajime Watanabe, Itami, Japan

[73] Assignee: Mitsubishi Denki Kabushiki Kaisha, Tokyo, Japan

[21] Appl. No.: 392,477

[22] Filed: Feb. 22, 1995

[30] Foreign Application Priority Data

Feb. 23, 1994 [JP] Japan .................................. 6-025550

[51] Int. Cl.⁶ .................................................. G11C 7/00
[52] U.S. Cl. ........................... 365/149; 365/174; 365/187; 257/303; 257/306; 257/307
[58] Field of Search ................................ 365/149, 174, 365/187; 257/71, 301, 303, 306, 307

[56] References Cited

U.S. PATENT DOCUMENTS

| | | | |
|---|---|---|---|
| 4,198,694 | 4/1980 | Eaton, Jr. et al. | 365/149 |
| 4,247,919 | 1/1981 | White, Jr. et al. | 345/149 |
| 4,651,306 | 3/1987 | Yanagisawa | 365/149 |

*Primary Examiner*—David C. Nelms
*Assistant Examiner*—Vu A. Le
*Attorney, Agent, or Firm*—Leydig, Voit & Mayer

[57] ABSTRACT

A memory cell structure for a semiconductor device includes a capacitor for storing electric charge, a first transistor for controlling storage and release of charge in the capacitor, and a second transistor interposed in a conduction path which connects the capacitor and the first transistor to each other. The second transistor serves as a cut-off transistor for interrupting the electrical connection between a charge storing capacitor and the first transistor when the capacitor is in the charged state, to thereby prevent effectively the charge from leaking by way of the source region of the first transistor. A dynamic semiconductor memory device includes a memory cell array having a plurality of memory cells of this.

9 Claims, 10 Drawing Sheets

5,532,956

MEMORY CELL STRUCTURE FOR SEMICONDUCTOR DEVICE AND DYNAMIC SEMICONDUCTOR MEMORY DEVICE

BACKGROUND OF THE INVENTION

1. Field of the Invention

The present invention relates to a structure of a memory cell of a memory cell array incorporated in a semiconductor device such as a dynamic semiconductor memory device and the like which are widely employed as a memory in personal computers, IC card and the like. More particularly, the present invention is concerned with an improved memory cell structure of a memory cell array which can effectively suppress leakage of electrical charge stored in a charge storing capacitor constituting a part of the memory cell.

2. Description of Related Art

The dynamic semiconductor memory device as mentioned above is widely used as a memory device for personal computers, IC cards and the like. For better understanding of the present invention, its technical background will be described in some detail by reference to the drawings.

FIG. 7 is a block diagram showing a typical electrical circuit configuration of a dynamic memory device known heretofore. Referring to FIG. 7, the illustrated dynamic memory device is implemented in such a structure as explained below. Address input signals A0 to A9 applied to address input terminals from a central processing unit or CPU (not shown) are temporarily stored in a row and column address buffer 1 and outputted therefrom to a row decoder 5 and a column decoder 7, respectively, under the timing of a clock signal generated by a clock generator 3, whereby store locations, i.e., the locations determined by the row addresses and the column addresses of the memory cell array 9 at which the data are to be stored, are determined. In that case, the data input through the data input terminals are temporarily stored in an input data buffer 11 before being stored in the store locations of the memory cell array 9, determined as mentioned above, after amplification by a sense refresh amplifier 13 in synchronism with a clock signal generated by the clock generator 3 so long as no write signal is input. On the other hand, operation for reading out the data from the memory cell array 9 is performed under the timing of a clock signal generated by the clock generator 3 via the sense refresh amplifier 13 to be subsequently stored temporarily in an output data buffer 15, wherein the data held in the output data buffer 15 are output to data output terminals under the timing of a relevant clock signal generated by the clock generator 3 during a period in which no write signal is applied.

FIG. 8 is an enlarged sectional view showing fragmentarily a physical structure of the memory cell array 9. As can be seen in the figure, each of the memory cells of the memory cell array 9 is composed of a charge storing capacitor generally denoted by a reference numeral 101 and having an upper electrode portion 101a and a lower electrode portion 101b, an MOS transistor generally denoted by a numeral 103 for controlling storage and release of charge in and from the capacitor 101 (i.e., data write and read operations), and a contact region 105 for electrically connecting the lower electrode portion 101b of the capacitor 101 and a source region 109 of the MOS transistor 103 to each other.

Each of the MOS transistors 103 is comprised of the source region 109 mentioned above and a drain region 111 both formed in a substrate 107 and a gate region 113 for controlling the state of conduction between the source region 109 and the drain region 111, wherein a gate insulation oxide film 113a is interposed between a bottom surface of the gate region 113 and a top surface of the substrate 107, while both lateral surfaces and the top surface of each gate region 113 are covered with an insulation film 113b. Further, bit wires 115 serving for transmission of information or data read out from the memory cell to the sense amplifier as well as transmission of data to be written in the memory cell are deposited over and across the gate regions 113 of the adjacent memory cells and the drain regions 111 disposed therebetween, respectively.

FIG. 9 is a partially enlarged view of FIG. 8 showing in more detail a fragment of the memory cell array 9, and FIG. 10 is a circuit diagram showing an equivalent circuit thereof. In FIG. 10, a reference numeral 117 denotes a word wire connected to the gate 113 for controlling the on/off state thereof.

In the memory cell array 9 realized in the structure described above, the gate 113 is opened or closed (i.e., controlled to be off or on) by the signal on the word wire 117 to thereby turn off or on the MOS transistor 103. In this way, the capacitor 101 can be charged or discharged in response to the signal on the bit wire 115.

As will be appreciated by examining in FIGS. 9 and 10, the electrical charge stored or accumulated in the capacitor 101 of each of the memory cells is likely to leak through a boundary defined between the source region 109 and the substrate 107 via the contact 105 even when the MOS transistor 103 is in the nonconducting state, incurring a corresponding decrease of charge stored in the capacitor 101. The leakage current thus generated is primarily composed of a leakage current component a flowing to the drain 111 via the gate 113, a leakage current component b flowing from an upper edge portion of the source region 109 to the substrate 107, a leakage current component c flowing from a location close to a contact region between the source region 109 and a LOCOS (LOCalized Oxidation of Silicon) region 119 to the substrate 107, and a leakage current component d flowing outwardly through the source region 109 from the other portion of the boundary defined between the source region 109 and the substrate 107.

As the causes for generation of the leakage current components mentioned above, there may be conceived damage which the boundary surface of the source region 109 (inter alia, the edge regions located at both sides of the source region 109) may undergo during etching, sputtering and other processes in the course of manufacturing of the semiconductor memory device, stress applied to the boundary between the source region 109 and the LOCOS region 119 during a thermal process for forming the LOCOS region 119, an electric-field ascribable stress applied in the ordinary operation and others. In this conjunction, it should be mentioned that the leakage current components b and c are usually greater than the leakage current components a and d.

FIG. 11 is a timing chart illustrating operations performed on the capacitor of the memory cell. In the figure, a voltage appearing acrose the capacitor is taken along the ordinate with the time being taken along the abscissa, wherein a curve shown at (A) represents the voltage applied across the capacitor, a curve shown at (B) represents a voltage appearing across a capacitoe in the memory cell of the memory cell array 9 known heretofore, and a curve shown at (C) represents a capacitor voltage of the memory cell in a memory cell array realized according to the teachings of the present invention, as will be described later on.

Now, operation of the hitherto known memory cell 9 will be explained by reference to FIGS. 7, 10 and 11. Assuming that a write signal of high level is applied to the gate 113 from the word wire 117 at a time point t1, the gate 113 is turned on, whereby the MOS transistor 103 is switched to the conducting state (i.e., "ON" state), which results in a current flow through the MOS transistor 103 from the bit wire 115. As a consequence, a voltage of a corresponding level is applied across the capacitor 101 which is thus charged up to a saturated state or level. At a time point t2, the write signal applied to the gate 113 from the word wire 117 is switched to a low level. However, the capacitor 101 is maintained in the saturated state until the MOS transistor 103 becomes nonconducting. At this time point t2, the supply of the charge to the capacitor 101 is interrupted, and the charge stored in the capacitor 101 leaks to the substrate 107 by way of the contact region 105 and the source region 109, as described previously in conjunction with FIG. 9. Thus, the voltage appearing across the capacitor 101 decreases gradually. When the voltage of the capacitor 101 decreases from the predetermined voltage level to such a level at which the data stored or memorized in terms of a quantity of charge cannot be restored even when the refresh operation known per se is performed, the data as stored will be lost. Accordingly, before the voltage of the capacitor 101 falls below the predetermined value, the capacitor 101 has to be charged to the saturated state via the sense refresh amplifier 13 in synchronism with a clock signal generated periodically at a predetermined time interval (e.g. at t3). This is what is called the refresh operation.

FIG. 12 is a view graphically illustrating changes in fail bit numbers as a function of time lapse due to the leakage currents in memory cell arrays which have a predetermined memory capacity (e.g. 1M bytes) and which differ from one another in respect to the charge storing capacity of the individual memory cells. In this figure, the fail bit number is taken along the ordinate while the time lapsing from the time point at which the MOS transistor 103 is turned off (i.e., switched to the nonconducting state) is taken along the abscissa in milliseconds. Further, in FIG. 12, curves (a), (b) and (c) represent changes in the fail bit number in the memory cell arrays of which memory cells have small, medium and large charge storing capacities, respectively, whereas a curve (d) represents the change in the fail bit number in a memory cell array realized according to the teachings of the present invention which will be described hereinafter and having a same storage capacity as the memory cell array represented by the curve (a).

As can be seen from FIG. 12, in the conventional memory cell array 9, the charge storing capacity of the individual memory cells, i.e., that of the capacitor 101, will have to be increased in order to decrease the fail bit number and hence the ratio of the leakage current to the charge storing capacity of the memory cell. This in turn means that the refreshing time interval will have to be shortened to a value on the order of 10 ms, as adopted commonly in the conventional dynamic semiconductor memory devices.

With the memory cell structure of the semiconductor memory device known heretofore in which each memory cell is composed of one MOS transistor 103 and one charge storing capacitor 101 and in which the lower electrode 101b of the capacitor 101 is directly connected to the source region 109 of the MOS transistor 103 via the contact region 105 having a high electrical conductivity (or low resistance, to say in another way), the charge stored in the capacitor 101 decreases at a relatively high rate (i.e., within a relatively short time) due to leakage of the charge via the contact 105 of a low ohmic resistance and the boundary or junction between the source region 109 and the substrate 107 to the substrate 107, which causes the charge or data holding or memorizing capability of the memory cell array 9 to be remarkably lowered, giving rise to a problem.

Under the circumstances, in order to hold unchangeably the data stored at each memory cell without fail, the individual memory cells have to be refreshed at a relatively short time interval or alternative the charge storing capacity of the memory cell has to be increased in order to decrease the ratio of leakage of the charge to the charge storing capacity of the memory cell. However, the refreshing operations executed at a relatively short time interval provide a great obstacle to realization of high-speed operation of the memory cell array 9. On the other hand, increasing of the charge storing capacity of the individual memory cells incurs not only a correspondingly increased cell size but also an increase in power consumption, another disadvantage.

SUMMARY OF THE INVENTION

In the light of the state of the art described above, it is an object of the present invention to provide a memory cell structure for a semiconductor device in which the electrical connection between a charge storing capacitor and a source of a first transistor (MOS transistor) is virtually cut off so long as neither storing of charge in the capacitor (charge or write operation) nor releasing of the charge from the capacitor (discharge or read operation) is performed, to thereby prevent effectively the charge once stored in the capacity from leaking by way of the source region of the first transistor.

Another object of the present invention is to provide a dynamic semiconductor memory device which can preserve data as stored for an extended time without requiring frequent refresh and which can ensure a low power consumption for the memory cell array.

In view of the above and other objects which will become apparent as the description proceeds, there is provided according to a first aspect of the present invention a memory cell structure for a semiconductor device, which includes a capacitor for storing electrical charge, a first transistor for controlling storage and releasing of the charge to and from the capacitor, and a second transistor interposed in an electrically conductive path which connects electrically the capacitor and the first transistor to each other for switching on and off the electrically conductive path.

By virtue of the memory cell structure described above, the electrical connection between the capacitor and the source region of the first transistor can virtually be cut off so long as the charging of the capacitor (write operation) or the discharging thereof (read operation) is not performed, whereby leakage of the charge from the capacitor via the source region of the first transistor can be positively suppressed. Thus, the time interval for periodically refreshing the memory array can be lengthened without need for increasing the charge storing capacity of the individual memory cells. The power consumption of the memory cell array can thus be suppressed to a minimum.

Further, according to a second aspect of the invention, there is provided a memory cell structure for a semiconductor device, which includes a capacitor for storing electrical charge, a first transistor for controlling storage and releasing of the charge to and from the capacitor, a contact region for electrically connecting a lower electrode of the capacitor to a source region of the first transistor, and a gate for controlling the conduction state of the contact region, wherein the contact region is comprised of a region of low resistance, a region of high resistance connected in series to the low-resistance region, and a channel forming region connected in series to the low-resistance region and in parallel to the high-resistance region, wherein the conduction state of the channel forming region is controlled via the gate.

By virtue of the memory cell structure described above, electrical connection between the charge storing capacitor and the source region of the first transistor can virtually be cut off by rendering nonconductive the channel forming region through the medium of the gate region in the state in which the charging or discharging of the capacitor is not effected, whereby leakage of the charge from the capacitor by way of the source region of the first transistor can be positively be suppressed. Thus, when compared with the conventional memory cell array, the memory refreshing interval can be lengthened without need for increasing the charge storing capacity of the individual memory cells. Besides, low power consumption can be realized because there is no need of increasing the charge storing capacity of the individual memory cells.

In a preferred mode for carrying out the invention, a gate for controlling the conduction state (i.e., on/off state) between the source region and a drain region of the first transistor may be implemented integrally with the on/off control gate for controlling the conduction state (i.e., on/off state) of the channel forming region.

With the memory cell structure described in the above paragraph in which the gate region for controlling the conduction state between the source region and the drain region of the first transistor is implemented integrally with the gate region for controlling the on/off state of the channel forming region, the process for manufacturing the memory cell array and hence the semiconductor device incorporating the memory cell array can be simplified with the manufacturing cost being lowered. Additionally, by forming the gate region mentioned above in a small size, miniaturization of the memory cell as well as the memory cell array and hence the semiconductor device incorporating it therein can be realized without encountering any appreciable difficulty.

In another preferred mode for carrying out the invention, the gate for controlling the conduction (i.e., on/off-state) between the source region and the drain region of the first transistor may be implemented separately from the on/off control gate for controlling the conduction state of the channel forming region, wherein the channel forming region may be deposited annularly so as to surround or encircle the high-resistance region, and wherein the on/off control gate for controlling conduction of the channel forming region is deposited so as to surround the annular channel forming region.

By virtue of the memory cell structure described above in which the gate for controlling the conduction state between the source region and the drain region of the first transistor is formed separately from the gate for controlling the on/off state of the channel forming region, the contact region can easily be deposited substantially at a center portion of the source region of the first transistor irrespective of the position at which the gate region of the first transistor is disposed, whereby a high-precision finishing process of the insulation side wall for the first transistor can be avoided, which leads to simplification of the manufacturing process. Additionally, because the channel forming region is disposed annularly so as to encircle the high-resistance region, the conduction path formed by the annular channel forming region can be imparted with a large cross-sectional area even when the contact region is implemented with a small cross-sectional area, whereby the memory cell as well as the memory cell array and the semiconductor device can easily be implemented in a miniaturized structure, as desired.

In yet another preferred mode for carrying out the invention, the gate for controlling conduction (i.e., on/off state) between the source region and a drain region of the first transistor may be implemented integrally with an on/off control gate for controlling conduction of the channel forming region, wherein the high-resistance region and the annular channel forming region surrounding the high-resistance region may be deposited to extend through an opening or aperture formed in the integrally implemented gate region, and wherein the channel forming region may be surrounded or encircled by the integrally implemented gate region.

In the above-mentioned memory cell structure in which the gate for controlling the conduction between the source region and the drain region of the first transistor is formed integrally with the gate region for controlling the on/off state of the channel forming region, the memory cell array and the semiconductor device incorporating it therein can be manufactured inexpensively with the process therefor being simplified. Besides, the memory cell as well as the memory cell array can be miniaturized by forming the integral gate region mentioned above in a reduced size. Furthermore, owing to the arrangement in which the channel forming region is encircled by the gate region implemented integrally with the high-resistance region and the annular channel forming region extending through the opening formed in the integral gate region, implementation of the high-resistance region and the channel forming region can be much facilitated, whereby the manufacturing process can further be simplified.

According to a third aspect of the invention, there is provided a memory cell structure for a semiconductor device, which includes a capacitor for storing electrical charge, a first transistor for controlling storage and releasing of charge in the capacitor, a contact having one end connected to a lower electrode of the capacitor and the other end disposed on a surface of a LOCOS region which is positioned adjacent to a source region of the first transistor, and a second transistor interposed in an electrically conductive path for electrically connecting the contact region to the source region of the first transistor.

With the above-mentioned memory cell structure, the electrical connection between the charge storing capacitor and the source region of the first transistor can virtually be cut off so long as neither the charging (write) nor discharging (read) operation is performed, whereby leakage of the charge from the capacitor via the source region of the first transistor can be remarkably diminished. Furthermore, because there is no need of providing the contact on the source region, the latter can be implemented in a reduced size, which can lead to miniaturization of the memory cell and hence that of the memory cell array and the semiconductor device incorporating therein.

The memory cell according to the present invention can profitably be applied to a dynamic semiconductor memory device.

Thus, there is provided according to a further aspect of the present invention a dynamic semiconductor memory device, which includes a memory cell array including a plurality of memory cells, and a refresh circuit for periodically refreshing the memory cell array, wherein each of the memory cells is comprised of a capacitor for storing electrical charge, a first transistor for controlling storage (charging) and releasing of charge (discharge) in the capacitor, and a second transistor interposed in an conductive path which connects electrically the capacitor and the first transistor to each other for switching on and off the electrically conductive path, wherein the second transistor virtually cuts off the electrically conductive path when the capacitor is in a charged state and when neither charging operation for writing information in the memory cell nor discharging operation for reading the information therefrom is performed for the capacitor.

Furthermore, according to a yet another aspect of the invention, there is provided a dynamic semiconductor memory device which includes a memory cell array including a plurality of memory cells, and a refresh circuit for periodically refreshing the memory cell array, wherein each of the memory cells is comprised of a capacitor for storing electrical charge, a first transistor for controlling storage (charging) and release of charge (discharging) in the capacitor, a contact connecting a lower electrode of the capacitor to a source of the first transistor, and a gate for controlling the conduction state of the contact, wherein the contact is comprised of a region of low resistance, a region of high resistance connected in series to the low-resistance region, and a channel forming region connected in series to the low-resistance region and in parallel to the high-resistance region, wherein conduction of the channel forming region is controlled by the gate such that the channel forming region is switched to a virtually nonconducting state when the capacitor is in charged state and when neither charging operation for writing information in the memory cell nor discharging operation for reading the information is performed for the capacitor.

Additionally, according to still another aspect of the invention, there is provided a dynamic semiconductor memory device, which includes a memory cell array including a plurality of memory cells, and a refreshing circuit for periodically refreshing the memory cell array, wherein each of the memory cells is comprised of a capacitor for storing electrical charge, a first transistor for controlling storage (charging) and release of charge (discharging) in the capacitor, a contact having one end connected to a lower electrode of the capacitor and the other end disposed on a surface of a LOCOS region which is disposed adjacent to a source region of the first transistor, and a second transistor interposed in an electrically conductive path for electrically connecting the contact to the source region of the first transistor, wherein the second transistor is so controlled as to virtually interrupt the electrically conductive path when the capacitor is in a charged state and when neither charging for writing information in the memory cell nor discharging for reading the information is performed for the capacitor.

The dynamic semiconductor memory devices mentioned above can equally enjoy the various advantages described above in conjunction with the memory cell structures and find various applications widely in personal computers, IC card devices and others.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

Figure 1:
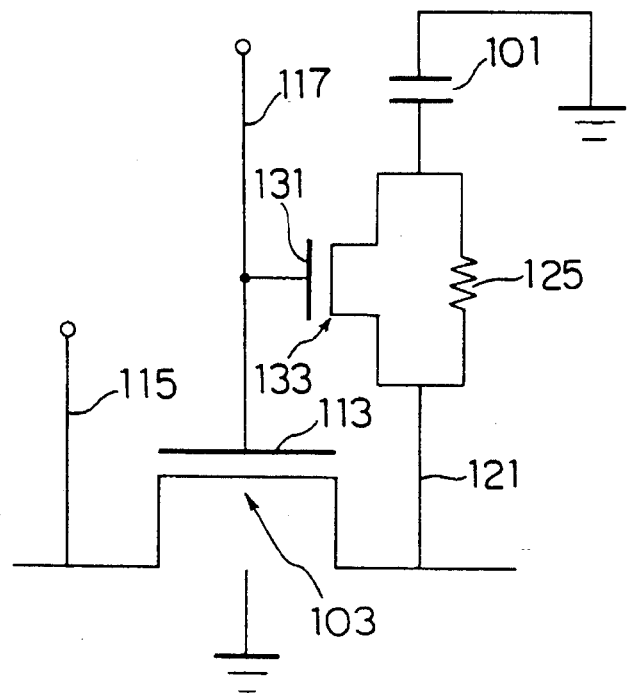
FIG. 1 is a circuit diagram showing an electrical circuit configuration of a memory cell for a semiconductor memory device according to a first embodiment of the present invention.

Now, the present invention will be described in detail in conjunction with what is presently considered as preferred or exemplary embodiments thereof by reference to the drawings. In the following description, like reference characters designate like or corresponding parts throughout the several views. Also in the following description, it is to be understood that such terms as "left", "right", "upper", "lower", and the like are words of convenience and are not to be construed as limiting terms.

Embodiment 1

Figure 2:
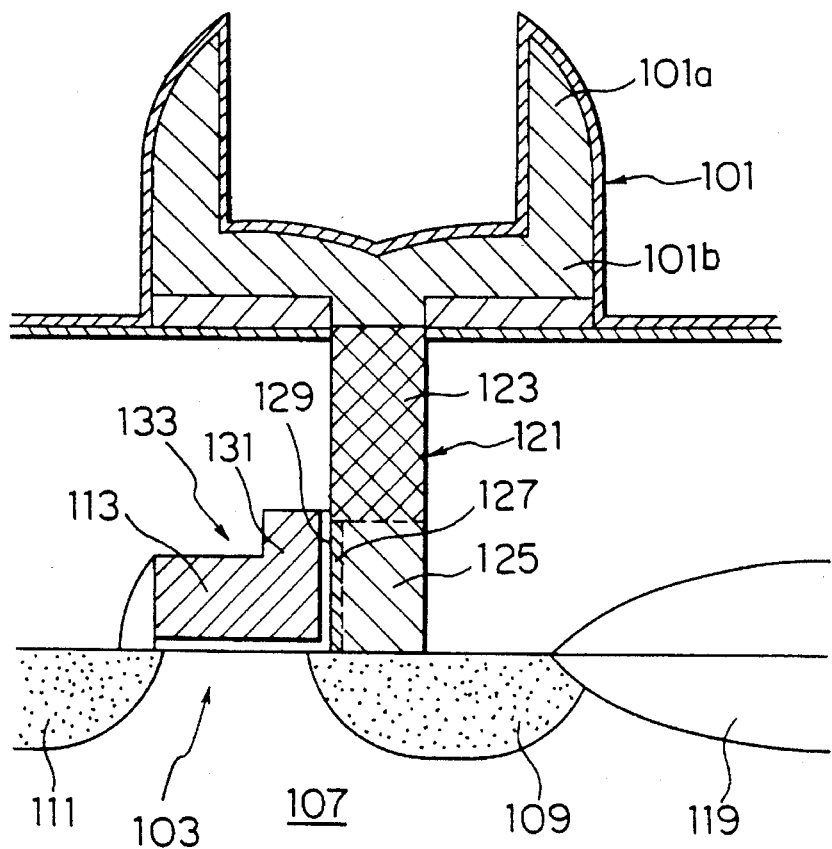
FIG. 2 is a sectional view showing a physical structure of the memory cell.

FIG. 1 is an equivalent circuit diagram showing an electric circuit configuration of a memory cell for a semiconductor memory device according to a first embodiment of the present invention, and FIG. 2 is a sectional view showing a structure of the memory cell mentioned above.

Referring to FIGS. 1 and 2, the memory cell according to the instant embodiment of the invention is comprised of a charge storing capacitor 101 having an upper electrode 101a and a lower electrode 101b, a MOS (Metal Oxide Semiconductor) transistor 103 (also referred to as the first transistor) having a source 109, a drain 111 and a gate 113 for controlling charging and discharging of the capacitor 101, and a cut-off transistor 133 (also referred to as the second transistor) interposed in a contact 121 serving as a electrically conductive path for electrically connecting the capacitor 101 and the MOS transistor 103 to each other, wherein the cut-off transistor 133 serves for interrupting or cutting off virtually the electrical connection between the capacitor 101 and the source 109 of the MOS transistor 103 for a period during which the capacitor 101 is neither charged (for write operation) nor discharged (for read operation).

In the case of the instant embodiment of the invention, the contact 121 is comprised of a low-resistance region 123 having a high dopant impurity concentration of a semiconductor material such as doped silicon, amorphous silicon or the like, wherein one end of the low-resistance region 123 contacts the lower electrode 101b of the capacitor 101, a high-resistance region 125 having a low dopant impurity concentration disposed between the other end of the low-resistance region 123 and the source region 109 of the MOS transistor 103 and integral with the low-resistance region 123 of a semiconductor material such as doped silicon, amorphous silicon or the like, and a channel forming region 127 at one side of the high resistance region 125, integral therewith, and having one end contacting to the other end of the low-resistance region 123, while the other end of the channel forming region 127 contacts the source region 109 of the MOS transistor 103. The channel forming region 127 is a semiconductor such as doped silicon, amorphous silicon or the like with a medium dopant impurity concentration (i.e., higher than that of the low-resistance region 123 and lower than that of the high resistance region 125).

At the outer side surface of the channel forming region 127 with an interposed of an insulation film 129, is a gate region 131 for controlling the conduction state of the channel forming region 127 and which is integral with the gate 113 for controlling the conducting state (i.e., on/off state) between the source region 109 and the drain region 111 of the MOS transistor 103. At this juncture, it should be mentioned that the channel forming region 127 and the gate region 131 cooperate as the cut-off transistor 133 (i.e., the second transistor).

Figure 11:
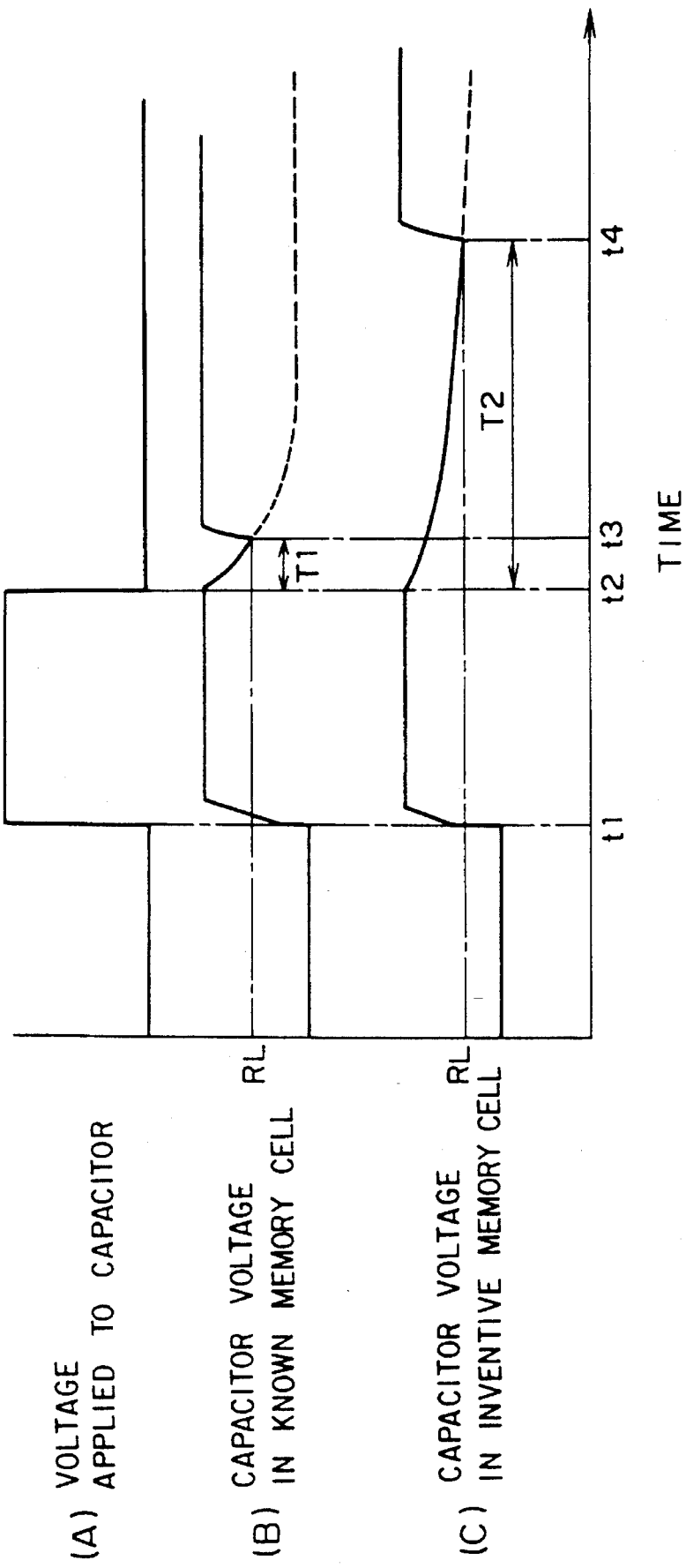
FIG. 11 is a timing chart illustrating operation of a capacitor constituting a part of a dynamic memory cell.

Next, description will turn to operation of the memory cell according to the instant embodiment by reference to FIGS. 1 and 2 together with a timing chart shown in FIG. 11 at (C). When a write signal is applied to the gates 113 and 131 from the word wire 117 at a time point t1, the gate 113 is closed (or turned on) to set the MOS transistor 103 and the cut-off transistor 133 to the conducting state, as a result of which a current flows through the MOS transistor 103 and the cut-off transistor 133 (i.e., through the channel forming region 127 which is in the conducting state) from the bit wire 115, whereby a voltage is applied to the capacitor 101 which is thus charged until it becomes saturated, as can be shown in FIG. 11 at (C). The saturated state of the capacitor 101 is held until the write signal applied to the gates 113 and 131 from the word wire 117 becomes sufficiently low to switch the MOS transistor 103 and the cut-off transistor 133 to the nonconducting state at a time point t2.

After interruption of the charge supply to the capacitor 101 at the time point t2, the charge stored in the capacitor 101 tends to leak to the substrate 107 via the contact 121 and the boundary surface of the source region 109. At this time point, the cut-off transistor 133 is turned off. To say it in another way, the channel forming region 127 is nonconducting. As a consequence, the charge which can migrate to the source region 109 from the capacitor 101 by way of the channel forming region 127 and the high resistance region 125 is suppressed to an extremely small amount. Thus, the rate at which the charge of the capacitor 101 decreases is very low. As a result of this, the time T2 taken for the amount of the charge stored in the capacitor 101 to decrease to a level RL at which the refresh operation is to be performed is significantly extended when compared with the corresponding time span T1 in the conventional memory cell described hereinbefore in conjunction with FIGS. 9 and 10.

Figure 9:
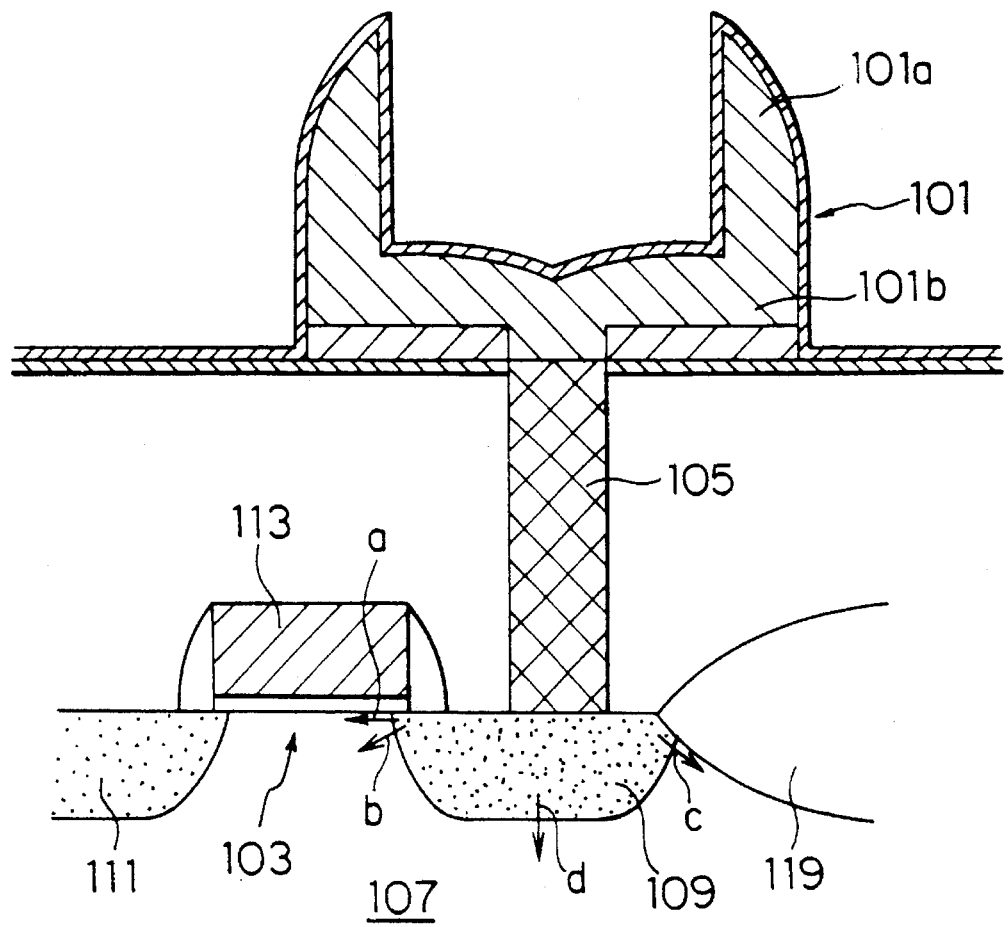
FIG. 9 is a fragmentary enlarged view showing in more detail a part of the memory cell array shown in FIG. 8.
Figure 10:
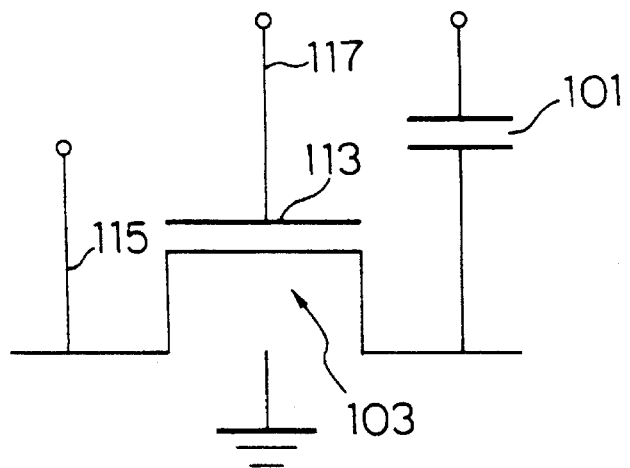
FIG. 10 is a circuit diagram showing an equivalent circuit of the same.
Figure 12:
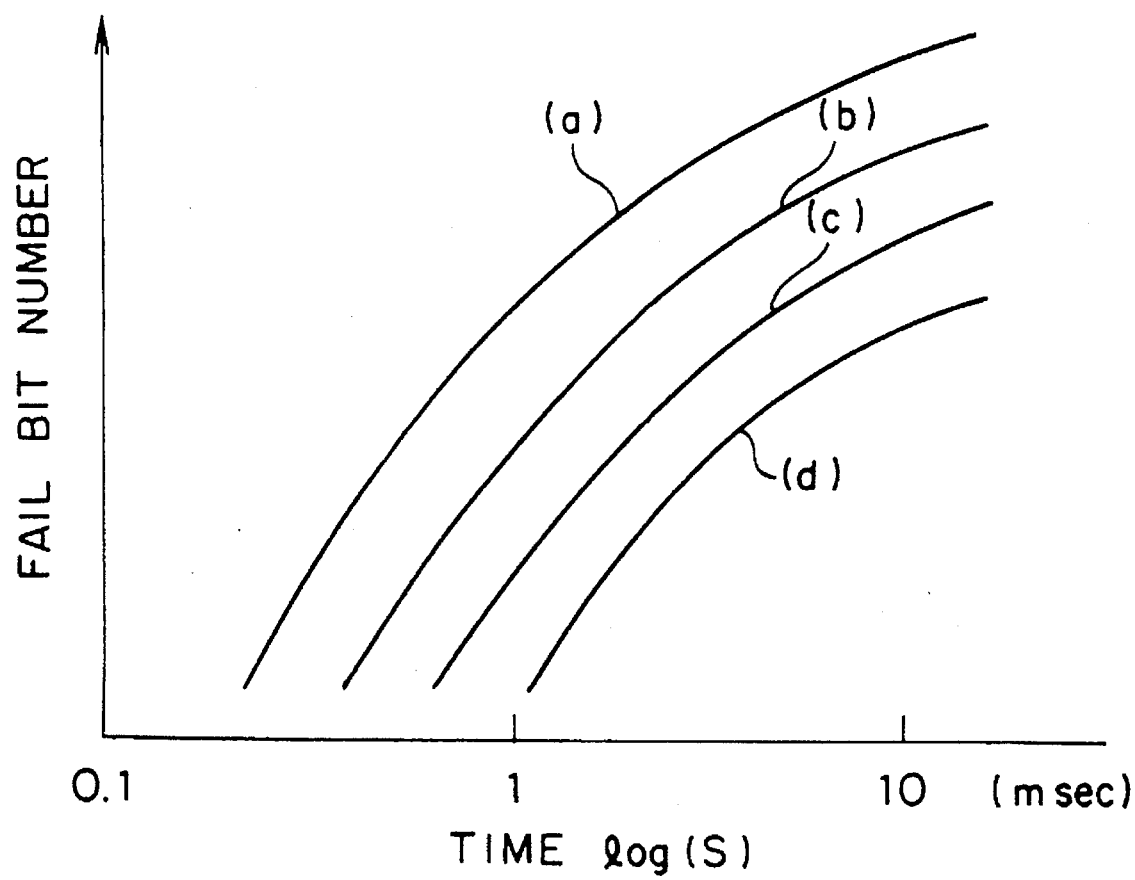
FIG. 12 is a view graphically illustrating experimentally observed changes in a fail bit number as a function of time lapse as brought about by leakage currents in memory cell arrays.

Because the leakage current of the memory cell according to the instant embodiment is suppressed to a very small value when compared with that of the conventional memory cell shown in FIGS. 9 and 10, the fail bit number (see FIG. 12, the curve (d)) due to the leakage current of the memory cell array comprised of the inventive memory cells, each having the structure described above, can be decreased remarkably when compared with the fail bit number (see FIG. 12, the curve (a)) in the memory cell array realized by using the conventional memory cells on the condition that the charge storing capacity of both the memory cell arrays is same.

Figure 7:
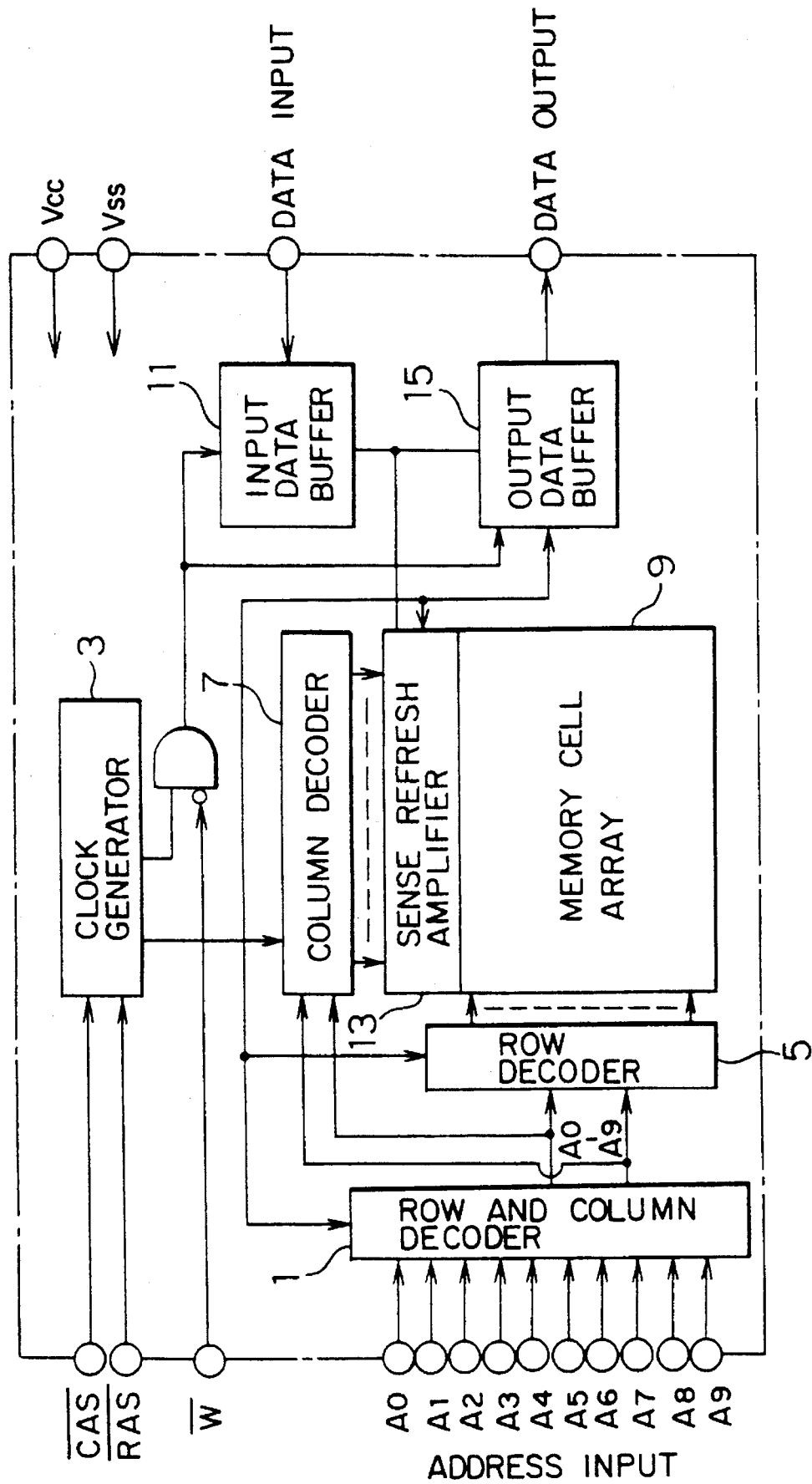
FIG. 7 is a block diagram showing a typical circuit structure of a dynamic semiconductor memory device known heretofore.
Figure 8:
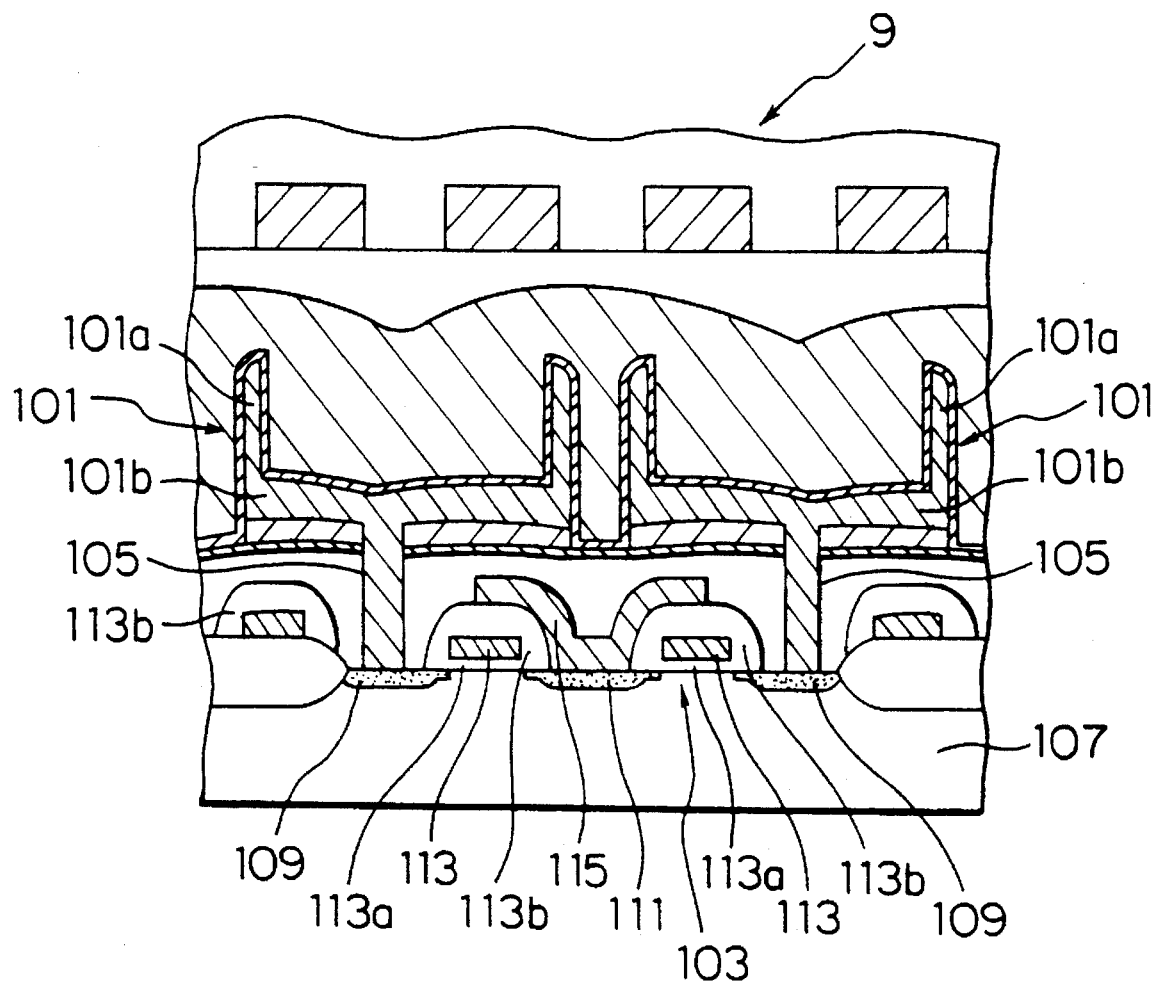
FIG. 8 is an fragmentary enlarged sectional view showing a portion of a memory cell array.

Before the voltage appearing across the capacitor 101 is lowered to the refresh level RL, the capacitor 101 is charged to the saturated state by the sense refresh amplifier 13 at a time point t4 in synchronism with a clock signal generated by the clock generator 3 periodically at a predetermined interval (refer to FIG. 7).

As is apparent from the foregoing description, according to the first embodiment, the channel forming region 127 is switched to the nonconducting state by the gate 113 to thereby virtually interrupt or cut off the electric connection between the capacitor 101 and the source 109 of the MOS transistor 103 so long as neither the charge storing operation nor the charge releasing operation are performed, whereby the leakage of the charge from the capacitor 101 via the source region 109 can be effective be suppressed, to a great advantage. Thus, the time interval at which the memory refresh operation is to be performed can be extended when compared with the conventional memory cell array described hereinbefore without any need for increasing the charge storing capacity. Besides, the problem of increased power consumption can be avoided because there is no necessity to increase the charge storing capacity of the individual memory cell.

Embodiment 2

Figure 3A:
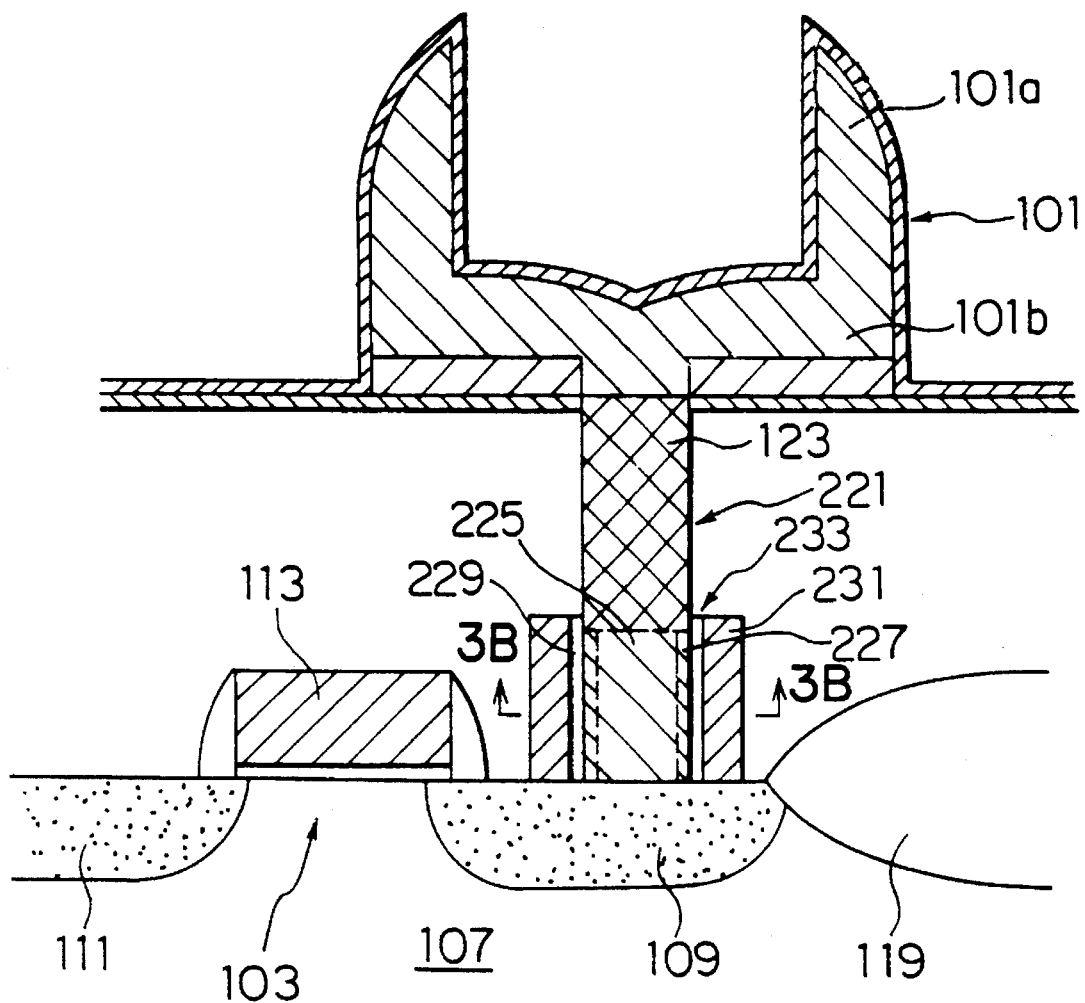
FIG. 3A is a sectional view of a memory cell structure according to a second embodiment of the present invention.
Figure 3B:
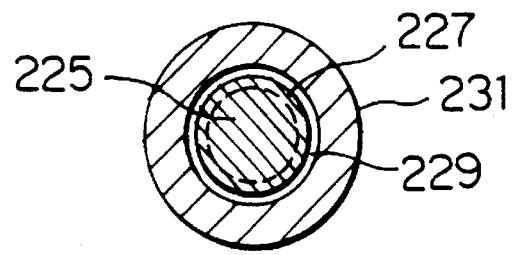
FIG. 3B shows the memory cell in a section taken along a line 3B—3B in FIG. 3A and viewed in the direction indicated by affixed arrows.

Next, a memory cell structure according to a second embodiment of the present invention will be described by reference to FIGS. 3A and 3B, in which FIG. 3A is a sectional view of the memory cell structure according to the second embodiment, and FIG. 3B shows the same in a section taken along a line 3B—3B in FIG. 3A. Referring to the figures, the gate 113 of the MOS transistor 103 is separate from the gate 231 of a cut-off transistor 233, wherein a channel forming region 227 of the cut-off transistor 233 is in an annular form with the gate 231 having in a cylindrical shape encircling an outer peripheral surface of the channel forming region 227. Except for these respects, the structure of the memory cell according to the instant embodiment is the same as that of the first embodiment described previously.

In the case of the memory cell structure according to the instant embodiment of the invention, the channel forming region 227 is annular. By virtue of this feature, the cross-sectional area of the channel forming region 227 the conduction path when the cut-off transistor 233 is in the conducting state, can be increased. This in turn means that the cross-sectional area of the contact 221 and the outer dimensions of the gate 231 deposited around the outer periphery of the contact 221 can be decreased correspondingly. Thus, the areas of the contact 221 as well as the upper surface of the source region 109 on which one end portion of the gate 231 is deposited can be decreased. As the overall effect, the memory cell can thus be miniaturized. Additionally, because the gates 113 and 231 are separate from each other, the contact 221 can easily be positioned or deposited substantially at a center portion of the source region 109 irrespective of the position of the gate 113 of the MOS transistor 103. Thus, when compared with the memory array structure shown in FIG. 2 where the contact 221 is deposited at one side of the source region 109, the necessity for finishing the insulation side wall of the MOS transistor 103 with high precision can be avoided, whereby the manufacturing process can correspondingly be simplified.

Embodiment 3

Figure 4:
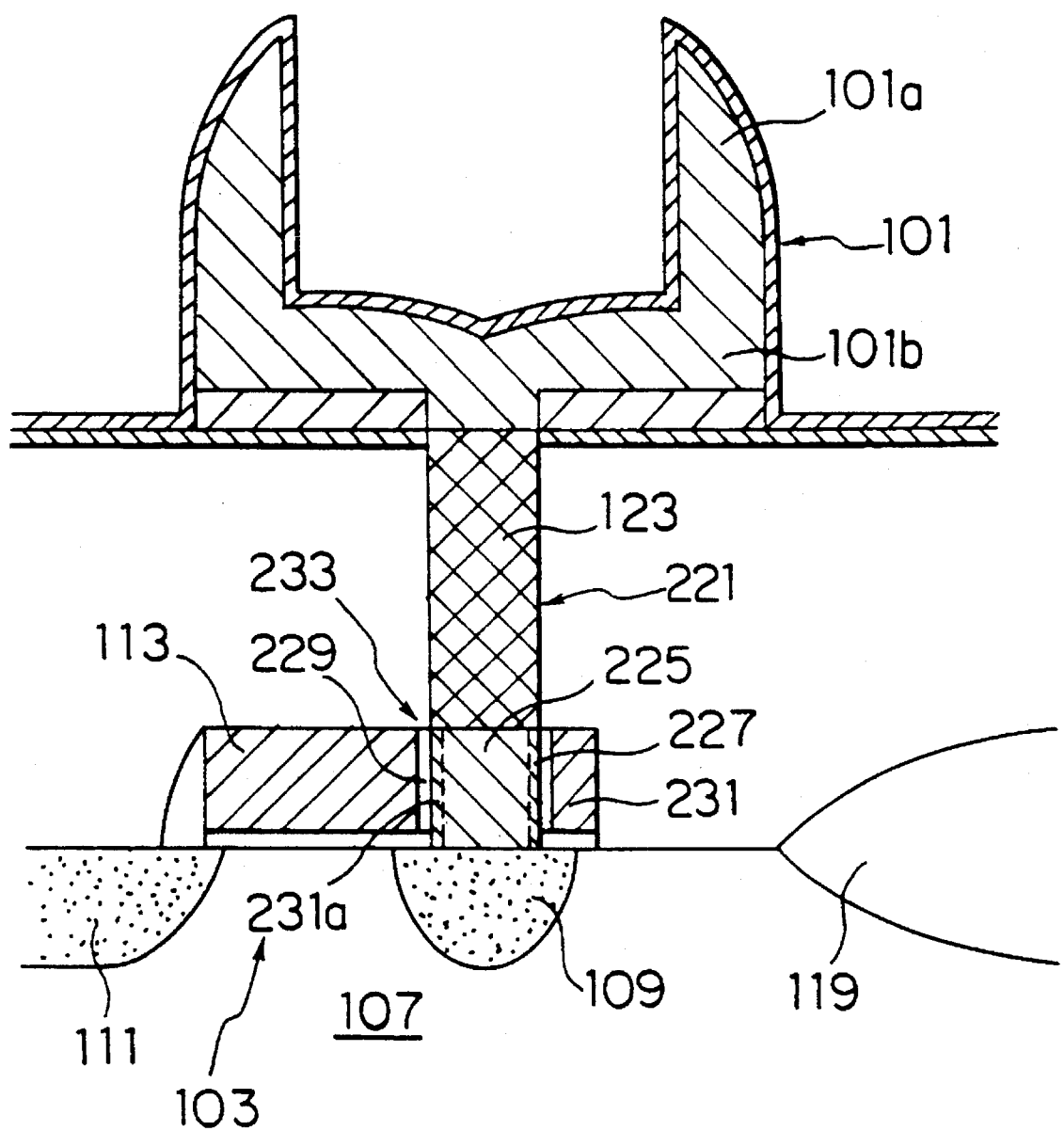
FIG. 4 is a sectional view showing a memory cell structure according to a third embodiment of the present invention.

Next, a third embodiment of the present invention will be described. FIG. 4 is a sectional view showing the memory cell structure according to the third embodiment of the invention. In the memory cell structure now under consideration, one end portion of the gate 113 of the MOS transistor 103 is extended and is integral with the gate 231 of the cut-off transistor 233, and an opening 231a is present in the elongated gate 231, wherein a high-resistance region 225 underneath the contact 221 extending from the lower electrode 101b of the capacitor 101 and the annular channel forming region 227 are positioned within the aperture 231a with lower end portions of the high-resistance region 225 and the channel forming region 227 contacting to the source region 109.

By virtue of the memory cell structure in which the high-resistance region 225 and the channel forming region 227 having the annular shape are deposited so as to extend through the aperture 231a formed in the gate of the integral structure, the manufacturing process can be simplified. Besides, because the gates 113 and 231 are not separate but integral with each other, the manufacturing process can further be simplified with the manufacturing efficiency being improved while ensuring a low manufacturing cost. Furthermore, since the outer end portion (right end portion as viewed in the figure) of the gate 231 is not disposed on the source region 109, there is no necessity of forming the insulation side wall on that end portion. Of course, the insulation side wall may be provided when the manufacturing process as adopted requires.

Embodiment 4

Figure 5:
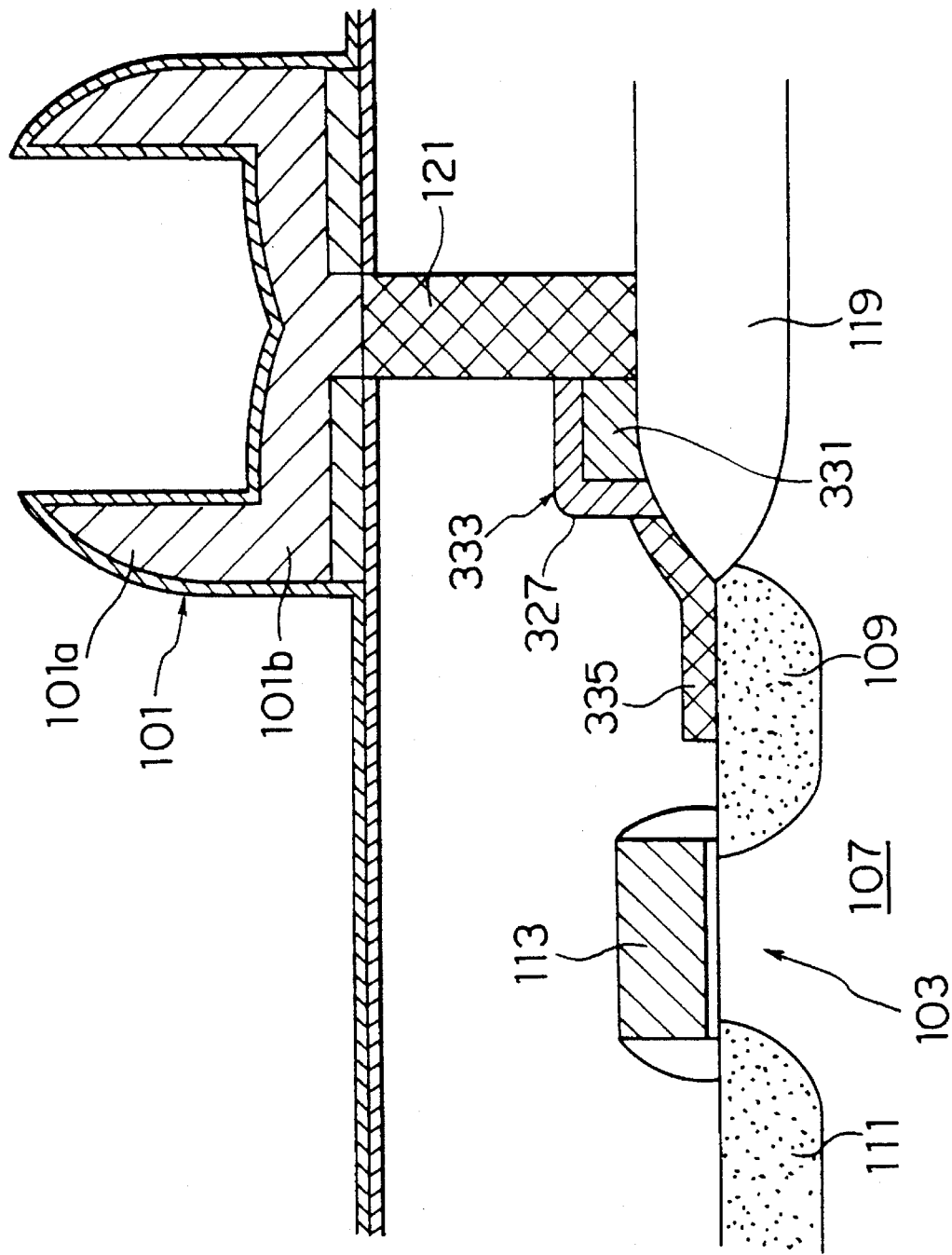
FIG. 5 is a sectional view showing a memory cell structure according to a fourth embodiment of the present invention.
Figure 6:
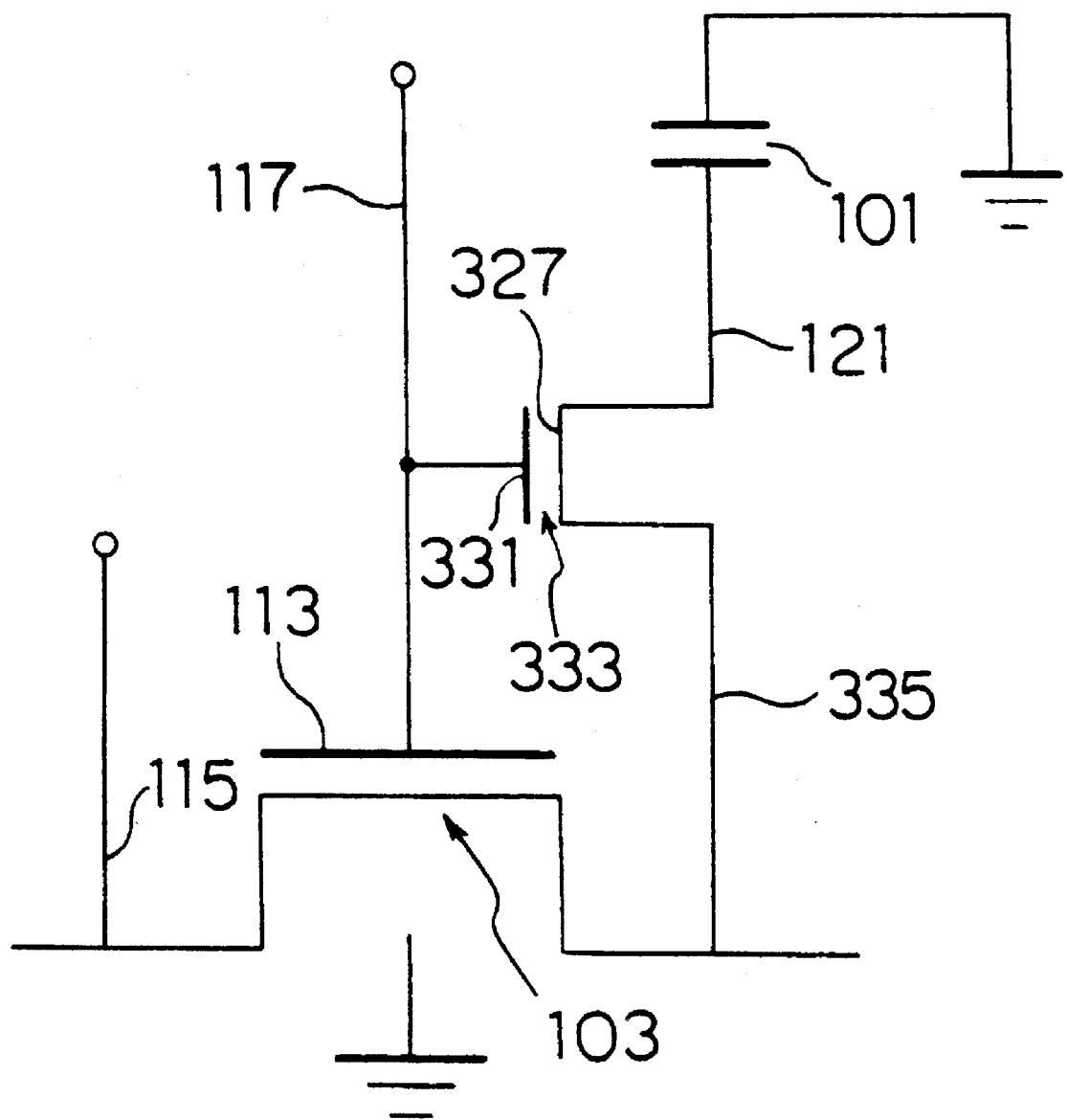
FIG. 6 is a circuit diagram showing an equivalent electrical circuit configuration of the memory cell for a semiconductor memory device according to the fourth embodiment of the present invention.

A fourth embodiment of the present invention will be described. FIG. 5 is a sectional view showing a memory cell structure according to a fourth embodiment of the invention. In the case of the memory cell structure according to the instant embodiment, a lower end portion of the contact 121 extending from the lower electrode of the capacitor 101 is deposited on the upper surface of the LOCOS region 119, wherein a lower portion of the contact 121 is connected to the source region 109 by way of a conductor 335 formed to extend between a cut-off transistor 333 formed on the LOCOS region 119 and the source region 109. The cut-off transistor 333 is comprised of an inverted L-like TFT 327 having one end contacting to a lower side surface of the contact 121 and the other end contacting to the conductor 335 and a gate 331 between the TFT 327 and the LOCOS region 119. Thus, the electrical connection between the contact 121 and the source 109 is susceptible to on/off control by the second transistor, the cut-off transistor 333.

With the memory cell structure in which the lower end of the contact 121 is deposited on the LOCOS region 119 rather than on the source region 109, the size (upper surface area) of the latter can be decreased, which thus allows the memory cell to be implemented in a reduced size. When the lower end of the contact 121 is located on the source region 109, the lower end of the contact 121 has to be positioned substantially at a center of the source region 109 of a relatively small area. As a consequence, the manufacturing process as well as process control becomes complicated due to the required positioning of the lower end of the contact 121. By contrast, in the memory cell structure according to the instant embodiment of the invention, the contact 121 is deposited on the LOCOS region 119 having a larger upper surface area than the source region 109. Thus, the manufacturing process as well as the control thereof is simplified with the manufacturing efficiency and the yield being significantly improved.

In the memory cell structure shown in FIG. 5, the conductor 335 extends to the source region 109. It should, however, be appreciated that the conductor 335 may extend to the gate 113.

Many modifications and variations of the present invention are possible in the light of the above techniques. It is therefore to be understood that within the scope of the appended claims, the invention may be practiced otherwise than as specifically described above.

What is claimed is:

1. A memory cell structure for a semiconductor device comprising:

a capacitor for storing electrical charge;

a first transistor for controlling storage and release of charge in said capacitor and having a gate for switching said first transistor between electrically opened and electrically closed states; and a second transistor interposed in an electrically conductive path electrically connecting said capacitor and said first transistor to each other for closing and opening said electrically conductive path, said second transistor having a gate for switching said second transistor between electrically open and electrically closed states, said gates of said first and second transistors being directly connected to each other for simultaneous switching of said first and second transistors between the electrically open and electrically closed states.

2. A memory cell structure for a semiconductor device comprising:

a capacitor for storing electrical charge;

a first transistor for controlling storage and release of charge in said capacitor and having a source region;

a contact region for electrically connecting a lower electrode of said capacitor to a source region of said first transistor;

a gate for controlling conduction of said contact region, wherein said contact region includes:

a region of low resistance;

a region of high resistance connected in series to said low-resistance region; and a channel forming region connected in series to said low-resistance region and in parallel to said high-resistance region, said gate controlling the conduction of said channel forming region.

3. The memory cell structure according to claim 2 including a gate for controlling conduction between said source region and a drain region of said first transistor integral with said gate controlling conduction of said channel forming region.

4. The memory cell structure according to claim 2 including a gate controlling conduction between said source region and a drain region of said first transistor is separate from said gate controlling conduction of said channel forming region wherein said channel forming region is annular and surrounds said high-resistance region and said gate controlling conduction of said channel forming region surrounds said channel forming region.

5. The memory cell structure according to claim 2 including a gate controlling conduction between said source region and a drain region of said first transistor integral with an said gate controlling conduction of said channel forming region, said high-resistance region and said annular channel forming region surrounding said high-resistance region extending through an opening in said gate, and said channel forming region being surrounded by said gate.

6. A memory cell structure for a semiconductor device comprising:

a capacitor for storing electrical charge;

a first transistor for controlling storage and release of charge in said capacitor and having a source region;

a contact region having one end connected to a lower electrode of said capacitor and another end disposed on a surface of a LOCOS region adjacent to a source region of said first transistor; and a second transistor interposed in an electrically conductive path electrically connecting said contact region to said source region of said first transistor.

7. A dynamic semiconductor memory device comprising:

a memory cell array including a plurality of memory cells; and a refresh circuit for periodically refreshing said memory cell array;

wherein each of said memory cells comprises:

a capacitor for storing electrical charge;

a first transistor for controlling storage and release of charge in said capacitor and having a gate for switching said first transistor between electrically open and electrically closed states; and a second transistor interposed in an electrically conductive path electrically connecting said capacitor and said first transistor to each other for opening and closing the electrically conductive path, said second transistor having a gate for switching said second transistor between electrically open and electrically closed states, said gates of said first and second transistors being directly connected to each other for simultaneous switching of said first and second transistors between the electrically open and electrically closed states, wherein said second transistor opens the electrically conductive path when a capacitor is charged and when the capacitor is being neither charged nor discharged.

8. A dynamic semiconductor memory device comprising:

a memory cell array including a plurality of memory cells; and a refresh circuit for periodically refreshing said memory cell array, wherein each of said memory cells comprises:

a capacitor for storing electrical charge;

a first transistor for controlling storage and release of charge in said capacitor;

a contact region for electrically connecting a lower electrode of said capacitor to a source region of said first transistor; and a gate for controlling conduction of said contract region, wherein said contact region includes:

a region of low resistance;

a region of high resistance connected in series to said low-resistance region; and a channel forming region connected in series to said low-resistance region and in parallel to said high-resistance region, wherein conduction of said channel forming region is controlled by said gate such that said channel forming region is switched to a conducting state during charging of said capacitor and to a non-conducting state when said capacitor is charged and is being neither charged nor discharged.

9. A dynamic semiconductor memory device comprising:

a memory cell array including a plurality of memory cells; and a refresh circuit for periodically refreshing said memory cell array, wherein each of said memory cells comprises:

a capacitor for storing electrical charge;

a first transistor for controlling storage and release of charge in said capacitor and having a source region and having a gate for switching said first transistor between electrically open and electrically closed states;

a contact having one end connected to a lower electrode of said capacitor and another end disposed on a surface of a LOCOS region adjacent to a source region of said first transistor; and a second transistor interposed in an electrically conductive path for electrically connecting said contact to said source region of said first transistor, said second transistor having a gate for switching said second transistor between electrically open and electrically closed states, said gates of said first and second transistors being directly connected to each other for simultaneous switching of said first and second transistors between the electrically open and electrically closed states, wherein said second transistor connects the electrically conducting path during charging of said capacitor and interrupts the electrically conductive path when said capacitor is charged and is neither being charged nor discharged.

* * * * *

UNITED STATES PATENT AND TRADEMARK OFFICE
CERTIFICATE OF CORRECTION

PATENT NO. : 5,532,956
DATED : July 2, 1996
INVENTOR(S) : Watanabe

It is certified that error appears in the above-indentified patent and that said Letters Patent is hereby corrected as shown below:

On the title page item [57], line 13, after "this" insert "structure";

Column 13, Line 9, delete "an";

Column 14, Line 10, change "contract" to --contact--.

Signed and Sealed this

Seventeenth Day of September, 1996

Attest:

BRUCE LEHMAN

*Attesting Officer*     *Commissioner of Patents and Trademarks*